(12) United States Patent
Janssens et al.

(10) Patent No.: US 11,199,771 B2
(45) Date of Patent: Dec. 14, 2021

(54) PRESSURE CONTROL VALVE, A FLUID HANDLING STRUCTURE FOR LITHOGRAPHIC APPARATUS AND A LITHOGRAPHIC APPARATUS

(71) Applicant: ASML NETHERLANDS B.V., Veldhoven (NL)

(72) Inventors: Stef Marten Johan Janssens, Eindhoven (NL); Koen Cuypers, Lommel (BE); Rogier Hendrikus Magdalena Cortie, Weert (NL); Sudhir Srivastava, Eindhoven (NL); Theodorus Johannes Antonius Renckens, Breda (NL); Jeroen Gerard Gosen, Mountain View, CA (US); Erik Henricus Egidius Catharina Eummelen, Veldhoven (NL); Hendrikus Johannes Schellens, Bergeijk (NL); Adrianus Marinus Wouter Heeren, St. Willebrord (NL); Bo Lenssen, Belfeld (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/339,402

(22) PCT Filed: Sep. 18, 2017

(86) PCT No.: PCT/EP2017/073509
§ 371 (c)(1),
(2) Date: Apr. 4, 2019

(87) PCT Pub. No.: WO2018/072943
PCT Pub. Date: Apr. 26, 2018

(65) Prior Publication Data
US 2020/0041895 A1 Feb. 6, 2020

(30) Foreign Application Priority Data

Oct. 20, 2016 (EP) ..................................... 16194817
Apr. 24, 2017 (EP) ..................................... 17167751

(51) Int. Cl.
*G03F 7/00* (2006.01)
*F16K 31/00* (2006.01)
(Continued)

(52) U.S. Cl.
CPC .......... *G03F 7/0002* (2013.01); *F16K 31/004* (2013.01); *F16K 37/005* (2013.01); *F16K 37/0041* (2013.01); *H01L 21/67017* (2013.01)

(58) Field of Classification Search
CPC .. G03F 7/0002; G03F 7/70341; F16K 31/004; F16K 31/007; F16K 31/008;
(Continued)

(56) References Cited

U.S. PATENT DOCUMENTS 4,038,998 A 8/1977 Taig
4,769,569 A 9/1988 Stahlhuth
(Continued)

FOREIGN PATENT DOCUMENTS

CN 1894526 1/2007
CN 1975225 6/2007
(Continued)

OTHER PUBLICATIONS

International Search Report and Written Opinion issued in corresponding PCT Patent Application No. PCT/EP2017/073509, dated Jan. 2, 2018.
(Continued)

*Primary Examiner* — Eric Keasel
(74) *Attorney, Agent, or Firm* — Pillsbury Winthrop Shaw Pittman, LLP (57) ABSTRACT

A pressure control valve has: a passageway having a flow opening; an member displaceable relative to the opening for
(Continued)

obstructing the opening by differing amounts; a piezo actuator; and a linkage mechanism adapted to amplify a dimensional change in the piezo actuator and to use the amplified dimensional change to displace the member relative to the opening, wherein the linkage mechanism comprises a frame attached to a wall and fixed at a first end in relation to the passageway, a portion of the frame moveable in a first direction while being substantially restrained in a second direction orthogonal to the first direction, the piezo actuator extending between the wall and the movable portion such that an expansion of the piezo actuator results in movement of the movable portion in the first direction by an amount greater than the expansion of the piezo actuator, the moveable portion connected to the member.

20 Claims, 5 Drawing Sheets

(51) Int. Cl.
*F16K 37/00* (2006.01)
*H01L 21/67* (2006.01)

(58) Field of Classification Search
CPC ...... F16K 37/0041; F16K 37/005; F16K 1/42; H01L 21/67017; H01L 21/67259; G05D 16/2013; H02N 2/043
See application file for complete search history.

(56) References Cited

U.S. PATENT DOCUMENTS

| | | | |
|---|---|---|---|
| 4,808,874 A | 2/1989 | Stahlhuth | |
| 5,270,984 A | 12/1993 | Mine | |
| 5,328,149 A * | 7/1994 | Reuter | F16K 31/007 251/129.06 |
| 5,660,207 A | 8/1997 | Mudd | |
| 5,946,969 A | 9/1999 | Munekata et al. | |
| 6,520,479 B1 | 2/2003 | Sato | |
| 6,981,518 B2 * | 1/2006 | Gilbert | F15C 5/00 137/599.07 |
| 7,311,693 B2 | 12/2007 | Shekalim | |
| 7,318,576 B2 * | 1/2008 | Bauerle | F16K 31/047 251/129.06 |
| 7,360,750 B2 | 4/2008 | Yano et al. | |
| 7,648,118 B2 * | 1/2010 | Ukpai | F16H 57/0447 251/11 |
| 9,395,011 B2 | 7/2016 | Ben-Ami | |
| 9,523,294 B2 | 12/2016 | Cho | |
| 9,581,263 B2 | 2/2017 | Reuter | |
| 10,222,707 B2 | 3/2019 | Polet et al. | |
| 2004/0207824 A1 | 10/2004 | Lof et al. | |
| 2006/0050256 A1 | 3/2006 | Takamura | |
| 2008/0036985 A1 | 2/2008 | Clarke et al. | |
| 2009/0201472 A1 | 8/2009 | Kato et al. | |
| 2010/0110398 A1 | 5/2010 | De Graaf et al. | |
| 2010/0208221 A1 | 8/2010 | Kramer et al. | |
| 2010/0313974 A1 | 12/2010 | Riepen et al. | |
| 2011/0107962 A1 | 5/2011 | Chen et al. | |
| 2012/0069309 A1 | 3/2012 | Cortie et al. | |
| 2014/0109995 A1 | 4/2014 | Moler | |
| 2015/0097467 A1 | 4/2015 | Griffin et al. | |
| 2016/0209762 A1 | 7/2016 | Novak et al. | |

FOREIGN PATENT DOCUMENTS

| | | |
|---|---|---|
| CN | 101807008 | 8/2010 |
| CN | 202674510 | 1/2013 |
| CN | 105459995 | 4/2016 |
| DE | 4406544 | 8/1995 |
| EP | 1158182 | 11/2001 |
| EP | 1199446 | 4/2002 |
| EP | 1420298 | 5/2004 |
| EP | 1466097 | 10/2004 |
| EP | 1564464 | 8/2005 |
| EP | 11715229 | 10/2006 |
| GB | 2157802 | 10/1985 |
| IL | 201029 | 12/2010 |
| JP | 62-009075 A | 1/1987 |
| JP | S62215176 | 9/1987 |
| JP | S62228664 | 10/1987 |
| JP | 63-026476 A | 2/1988 |
| JP | H01250920 | 10/1989 |
| JP | 1-279174 | 11/1989 |
| JP | 2-163580 | 6/1990 |
| JP | 3-234981 | 10/1991 |
| JP | 4-285377 A | 10/1992 |
| JP | H06241343 | 8/1994 |
| JP | H0694909 | 11/1994 |
| JP | 9-271181 A | 10/1997 |
| JP | 2000-314402 A | 11/2000 |
| JP | 2004178288 | 6/2004 |
| JP | 2004-523369 A | 8/2004 |
| JP | 2005-155691 | 6/2005 |
| JP | 2007-509291 A | 4/2007 |
| JP | 4166552 | 8/2008 |
| JP | 2009-267405 | 11/2009 |
| JP | 2012-044177 A | 3/2012 |
| JP | 2012-160760 | 8/2012 |
| JP | 2013-511254 A | 3/2013 |
| JP | 2013-120933 | 6/2013 |
| JP | 2015023588 | 2/2015 |
| JP | 2015-515595 A | 5/2015 |
| KR | 19990080511 | 11/1999 |
| KR | 10-2007-0095269 A | 9/2007 |
| KR | 10-2007-0102955 A | 10/2007 |
| KR | 10-2007-0112498 A | 11/2007 |
| TW | 201135105 | 10/2011 |
| WO | 99/49504 | 9/1999 |
| WO | 2005/038320 | 4/2005 |
| WO | 2005031820 | 4/2005 |
| WO | 2009/037724 | 3/2009 |
| WO | 2015169616 | 11/2015 |
| WO | 2016/006333 | 1/2016 |
| WO | 2016/035558 A1 | 3/2016 |
| WO | 2016209610 | 12/2016 |

OTHER PUBLICATIONS

Taiwanese Office Action issued in corresponding Taiwanese Patent Application No. 106135631, dated Oct. 9, 2018.
"Proportional Pressure Control Valves with Dimensions in the Millimetre Range", Research Disclosure, No. 622027, Jan. 14, 2016.
"Particle Free Ultrapure Proportional Valve", Research Disclosure, No. 626038, May 12, 2016.
Office Action dated Mar. 9, 2020 issued in corresponding Japanese Patent Application No. 2019-516964 with English translation.
Office Action dated Jul. 29, 2020 issued in corresponding Korean Patent Application No. 10-2019-7014221 (8 pgs.).
Notice of Reasons for Rejection dated Sep. 17, 2021, issued in corresponding Japanese Patent Application No. 2020-218688 with English translation (7 pgs.).
Office Action dated Aug. 11, 2021, issued in corresponding Chinese Patent Application No. 201780064970.X with English translation (15 pgs.).

* cited by examiner

PRESSURE CONTROL VALVE, A FLUID HANDLING STRUCTURE FOR LITHOGRAPHIC APPARATUS AND A LITHOGRAPHIC APPARATUS

CROSS-REFERENCE TO RELATED APPLICATIONS

This application is the U.S. national phase entry of PCT patent application no. PCT/EP2017/073509, which was filed on Sep. 18, 2017, which claims the benefit of priority of European patent application nos. 16194817.9 and 17167751.1, which were filed on Oct. 20, 2016, and Apr. 24, 2017, respectively, and each of which is incorporated herein in its entirety by reference.

FIELD

The present invention relates to a pressure control valve for gas, liquid or fluid control, a fluid handing structure which controls liquid or gas flows, or both and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in an immersion liquid having a relatively high refractive index, e.g. water, so as to fill a space between the final element of the projection system and the substrate. In an embodiment, the immersion liquid is ultra-pure water, although another immersion liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus). Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

In an immersion apparatus, immersion fluid is handled by a fluid handling structure. In an embodiment the fluid handling structure may supply immersion fluid and may be referred to as a fluid supply system. In an embodiment the fluid handling structure may at least partly confine immersion fluid to a region and may be referred to as a fluid confinement system. In an embodiment the fluid handling structure may provide a barrier to immersion fluid and thereby be referred to as a barrier member. In an embodiment the fluid handling structure creates or uses a flow of fluid, e.g. a flow of gas, for example to help in controlling the flow and/or the position of the immersion fluid. The flow of gas may form a seal to confine the immersion fluid.

In a fluid handling structure the performance can be improved by controlling the flow rate of liquid and/or gas into and/or out of openings in the fluid handling structure. Desirably flow rates can be varied quickly. It is desirable to position a pressure control valve regulating the flow rate of liquid and/or gas as close as possible to the openings to ensure best control and reaction time of the flow rate into or out of an opening. Additionally the space available in a fluid handling structure or close to a fluid handling structure is limited so desirably any pressure control valve has a small volume. Desirably it is possible to vary flow rates without introducing particles into the system and with a valve with a long lifetime and low thermal impact.

Another situation in which a flow control valve with long lifetime and low thermal impact is desirable is in a clamp for a substrate. WO 2015/169616 discloses a clamp in which the spatial profile of the substrate can be controlled by varying a level of pressure under a substrate thereby to vary the force on the substrate and so the spatial profile of the top surface of the substrate. Other situations in a lithographic apparatus may also require clean gas flows with controllable flow rates, for example gas flows directly at or in the vicinity of a patterning device such as a reticle or mask.

SUMMARY

It is desirable, for example, to provide a pressure control valve suitable for use in a fluid handling structure of a lithographic apparatus.

According to an aspect of the invention, there is provided a pressure control valve comprising: a passageway having a portion defining an opening for the flow of liquid and/or gas therethrough; an obstructing member displaceable relative to the opening for obstructing the opening by differing amounts thereby to regulate a volumetric flow rate of liquid and/or gas through the opening; a piezo actuator; and a linkage mechanism adapted to amplify a magnitude of a dimensional change in the piezo actuator and to use the amplified dimensional change to displace the obstructing member relative to the opening, wherein the linkage mechanism comprises a frame attached to a wall and fixed at a first end in relation to the passageway, a movable portion of the frame moveable in a first direction whilst being substantially restrained in a second direction orthogonal to the first direction, the piezo actuator extending between the wall and the moveable portion such that an expansion of the piezo actuator results in movement of the moveable portion in the first direction by an amount greater than the expansion of the piezo actuator, the moveable portion connected to the obstructing member.

According to an aspect of the invention, there is provided a pressure control valve comprising:
- a passageway having a portion defining an opening for the flow of liquid and/or gas therethrough;
- an obstructing member displaceable relative to the opening for obstructing the opening by differing amounts thereby to regulate a volumetric flow rate of liquid and/or gas through the opening; and
- an obstruction in the passageway which is central in the passageway and elongate in the direction of flow and constructed to split the flow of liquid and/or gas into two flows through the passageway.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
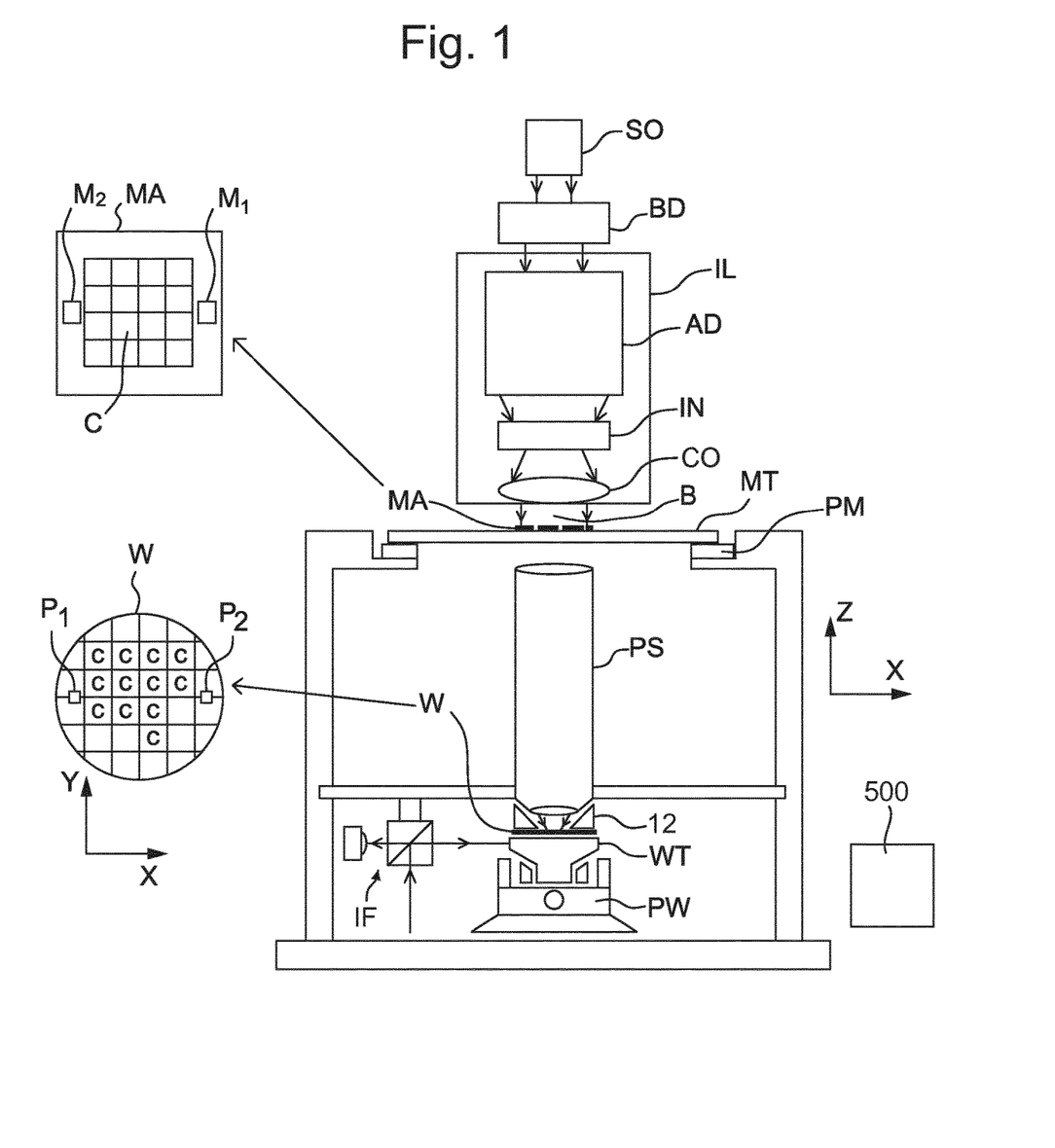
FIG. 1 depicts a lithographic apparatus according to an embodiment of the invention.

FIG. 1 schematically depicts a lithographic apparatus according to one embodiment of the invention. The apparatus comprises:
a. an illumination system (illuminator) IL configured to condition a projection beam B (e.g. UV radiation or DUV radiation);
b. a support structure (e.g. a mask table) MT constructed to support a patterning device (e.g. a mask) MA and connected to a first positioner PM configured to accurately position the patterning device MA in accordance with certain parameters;
c. a support table, e.g. a sensor table to support one or more sensors or a support table WT constructed to hold a substrate (e.g. a resist-coated substrate) W, connected to a second positioner PW configured to accurately position the surface of the table, for example of a substrate W, in accordance with certain parameters; and
d. a projection system (e.g. a refractive projection lens system) PS configured to project a pattern imparted to the projection beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two or more tables (or stage or support), e.g., two or more support tables or a combination of one or more support tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a support table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or supports) which may be used in parallel in a similar manner to substrate, cleaning, sensor and/or measurement tables.

Referring to FIG. 1, the illumination system IL receives a radiation beam from a source SO or radiation. The source SO and the lithographic apparatus may be separate entities, for example when the source SO is an excimer laser. In such cases, the source SO is not considered to form part of the lithographic apparatus and the radiation beam is passed from the source SO to the illumination system IL with the aid of a beam delivery system BD comprising, for example, suitable directing mirrors and/or a beam expander. In other cases the source SO may be an integral part of the lithographic apparatus, for example when the source SO is a mercury lamp. The source SO and the illumination system IL, together with the beam delivery system BD if required, may be referred to as a radiation system.

The illumination system IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as an integrator IN and a condenser CO. The illumination system IL may be used to condition the radiation beam, to have a desired uniformity and intensity distribution in its cross-section. Similar to the source SO, the illumination system IL may or may not be considered to form part of the lithographic apparatus. For example, the illumination system IL may be an integral part of the lithographic apparatus or may be a separate entity from the lithographic apparatus. In the latter case, the lithographic apparatus may be configured to allow the illumination system IL to be mounted thereon. Optionally, the illumination system IL is detachable and may be separately provided (for example, by the lithographic apparatus manufacturer or another supplier).

The projection beam is incident on the patterning device MA, which is held on the support structure MT, and is patterned by the patterning device MA. Having traversed the patterning device MA, the projection beam passes through the projection system PS, which focuses the beam onto a target portion C of the substrate W. With the aid of the second positioner PW and position sensor IF (e.g. an interferometric device, linear encoder or capacitive sensor), the support table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the projection beam, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the support table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks M1, M2 as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing immersion liquid between a final element of the projection system PS and the substrate can be classed into three general categories. These are the bath type arrangement, the so-called localized immersion system and the all-wet immersion system. In a bath type arrangement substantially the whole of the substrate W and optionally part of the support table WT is submersed in a bath of immersion liquid. In the all-wet immersion system the whole top surface of the substrate is covered in immersion liquid.

Figure 2:
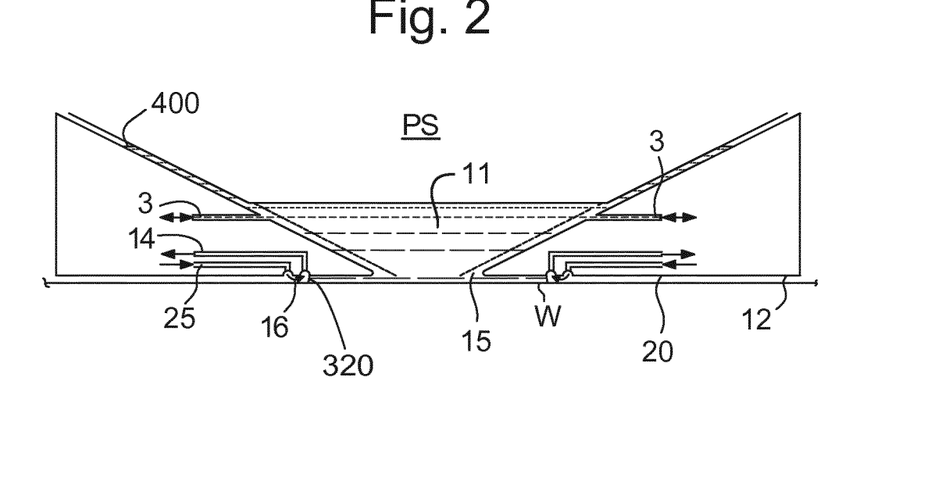
FIG. 2 depicts a fluid handling structure for use in a lithographic projection apparatus.
Figure 3:
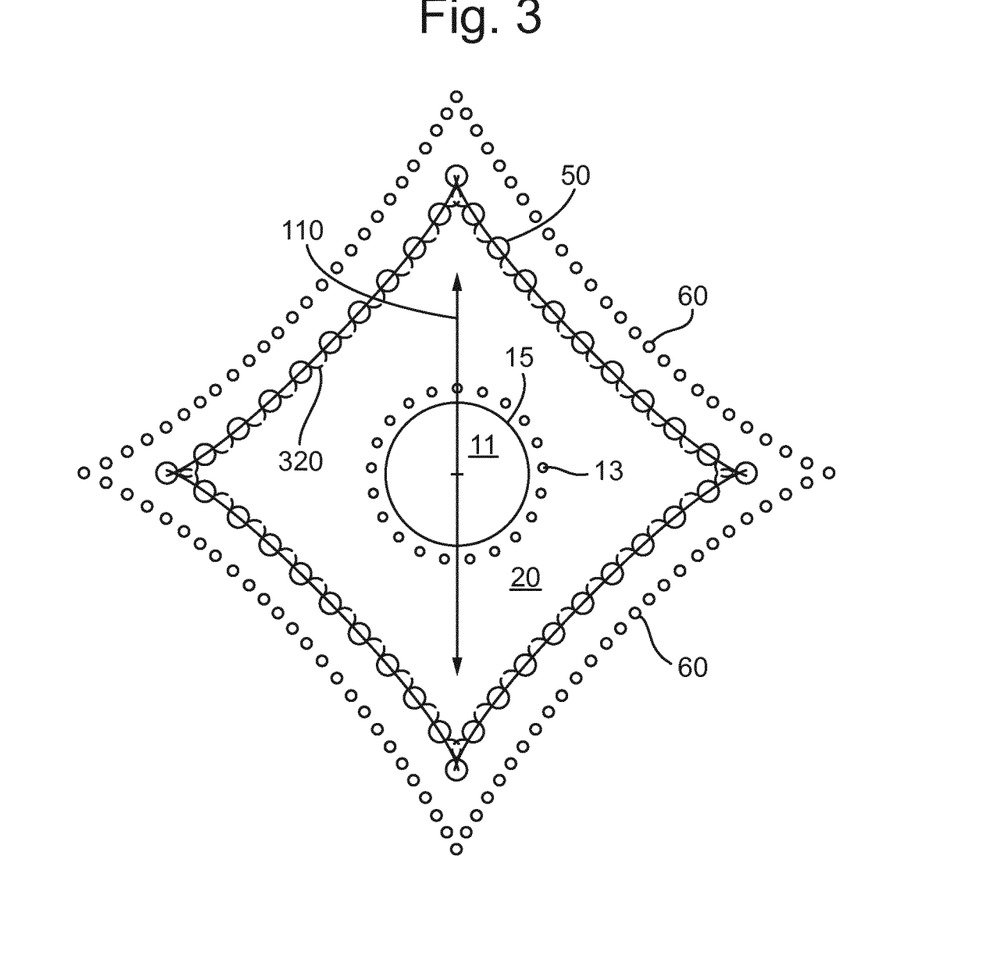
FIG. 3 is a bottom view that depicts a further fluid handling structure.

A localized immersion system uses a liquid supply system in which immersion liquid is only provided to a localized area of the substrate. The region filled by immersion liquid is smaller in plan than the top surface of the substrate and the region filled with immersion liquid remains substantially stationary relative to the projection system PS while the substrate W moves underneath that area. FIGS. 2 and 3 show different fluid handling structure which can be used in such a system. A sealing feature is present in a bottom surface 20 to seal immersion liquid to the localized area. One way which has been proposed to arrange for this is disclosed in PCT patent application publication no. WO 99/49504.

An arrangement which has been proposed is to provide the fluid handling structure with a structure which extends along at least a part of a boundary of a space between the final element of the projection system PS and the support table WT. Such an arrangement is illustrated in FIG. 2.

FIG. 2 schematically depicts a localized fluid handling structure 12. The fluid handling structure 12 extends along at least a part of a boundary of the space 11 between the final element of the projection system PS and the support table WT or substrate W. (Please note that reference in the following text to surface of the substrate W also refers in addition or in the alternative to a surface of the support table WT or an object, such as a sensor, on the support table WT, unless expressly stated otherwise.) The fluid handling structure 12 is substantially stationary relative to the projection system PS in the XY plane though there may be some relative movement in the Z direction (in the direction of the optical axis). In an embodiment, a seal is formed between the fluid handling structure 12 and the surface of the substrate W and may be a contactless seal such as a gas seal (such a system with a gas seal is disclosed in European patent application publication no. EP 1,420,298 A) or liquid seal.

The fluid handling structure 12 at least partly confines immersion liquid in the space 11 between the final element of the projection system PS and the substrate W. A contactless seal to the substrate W may be formed around the image field of the projection system PS so that immersion liquid is confined within the space 11 between the substrate W surface and the final element of the projection system PS and more generally to a region including between the fluid handling structure 12 and the substrate W adjacent the space 11. The space 11 is at least partly formed by the fluid handling structure 12 positioned below and surrounding the final element of the projection system PS Immersion liquid is brought into the space 11 below the projection system PS and within the fluid handling structure 12 by one of liquid openings 3. The immersion liquid may be removed by another of liquid openings 3. The immersion liquid may be brought into the space 11 through at least two liquid openings 3. Which of liquid openings 3 is used to supply the immersion liquid and optionally which is used to remove the immersion liquid may depend on the direction of motion of the support table WT. The fluid handling structure 12 may extend a little above the final element of the projection system PS. The liquid level rises above the final element so that a buffer of immersion liquid is provided. In an embodiment, the fluid handling structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The immersion liquid may be confined in the space 11 by a gas seal 16 which, during use, is formed between the bottom surface 20 of the fluid handling structure 12 and the surface of the substrate W. The surface 20 faces the substrate W and a seal is formed between that surface 20 and the substrate W. An aperture 15 is formed in the fluid handling structure 12 for the passage therethrough of the projection beam through immersion liquid in the space 11. The gas seal 16 is formed by gas. The gas in the gas seal 16 is provided under pressure via outlet 25 to the gap between the fluid handling structure 12 and substrate W. The gas is extracted via inlet 14. The overpressure on the gas outlet 25, vacuum level on the inlet 14 and geometry of the gap are arranged so that there is a high-velocity gas flow inwardly that confines the immersion liquid. The force of the gas on the immersion liquid between the fluid handling structure 12 and the substrate W confines the immersion liquid in the space 11. The inlets/outlets may be annular grooves which surround the space 11. The annular grooves may be continuous or discontinuous. The flow of gas is effective to confine the immersion liquid in the space 11. Such a system is disclosed in United States patent application publication no. US 2004-0207824, which is hereby incorporated by reference in its entirety.

In an embodiment, the fluid handling structure 12 does not have the gas seal 16.

FIG. 3 illustrates schematically features formed in the surface 20 of an alternative fluid handling structure 12. The surface 20 includes features to adapt the surface 20 for the extraction of the immersion liquid from the region. FIG. 3 illustrates schematically and in plan meniscus controlling features of a fluid handling structure 12 which may have outlets using the gas drag principle and to which an embodiment of the present invention may relate. The features of a meniscus controlling feature are illustrated which may, for example, replace the meniscus controlling features depicted by the gas seal 16, provided by the outlet 25 and the inlet 14 in FIG. 2. The meniscus controlling feature of FIG. 3 is a form of extractor, for example a dual phase extractor. The meniscus controlling feature comprises a plurality of discrete openings 50 in the surface 20 of the fluid handling structure 12. Thus, the surface 20 is adapted for the extraction of immersion fluid from the region. Each discrete opening 50 is illustrated as being circular, though this is not necessarily the case. Indeed, the shape is not essential and one or more of the discrete openings 50 may be one or more selected from: circular, elliptical, rectilinear (e.g. square, or rectangular), triangular, etc., and one or more openings may be elongate.

Radially inwardly of the discrete openings 50 and also in the surface 20 of the fluid handling structure 12 are a plurality of outlet openings 13. Immersion liquid is provided through outlet openings 13 to the region to which immersion liquid is provided. Outlet openings 13 surround the space 11 which is bounded by the aperture 15 formed in the fluid handling structure 12.

There may be no meniscus controlling features radially inwardly of the openings 50. The meniscus 320 is pinned between the discrete openings 50 with drag forces induced by gas flow into the discrete openings 50. A gas drag velocity of greater than about 15 m/s, desirably about 20 m/s is sufficient. The amount of splashing or leaking of fluid from the substrate W may be reduced, thereby reducing evaporation of fluid and thereby reducing thermal expansion/contraction effects.

Various geometries of the bottom of the fluid handling structure are possible. For example, any of the structures disclosed in U.S. patent application publication no. US 2004-0207824 or U.S. patent application publication no. US 2010-0313974 could be used in an embodiment of the present invention. An embodiment of the invention may be applied to a fluid handling structure 12 which has any shape in plan, or has a component such as the outlets arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star, for example, as depicted in FIG. 3.

Known lithographic apparatus may comprise a fluid handling structure 12 comprising a gas knife. The gas knife can be used to help confine immersion fluid to the space 11. Therefore, the gas knife can be useful in preventing immersion fluid from escaping from the space 11, which could later lead to defects. Providing a strong gas knife is useful in preventing film pulling at the trailing edge of the fluid handling structure 12. This is because a strong gas knife will reduce or prevent the amount of immersion fluid which is dragged behind the fluid handling structure 12. Additionally a strong gas knife may break up the film faster to reduce the amount of immersion fluid left behind the fluid handling structure 12. However, this may have other consequences at the leading edge of the fluid handling structure 12 if the flow rate of the gas knife is constant around the space 11. For example, using a strong gas knife will increase "bulldozing" at the leading edge of the fluid handling structure 12. This is because as the substrate W moves, the leading portion of the fluid handling structure 12 collides with the droplet of immersion fluid and the droplet is pushed forwards by the fluid handling structure 12. As the droplet is pushed forward, defects are created on the surface of the substrate W. Therefore, it may be beneficial if the flow rate of the gas knife can be adjusted, depending on the location it is applied. For example, a flow rate at the leading edge of the fluid handling structure 12 through the exits 60 is reduced to allow droplets of liquid on a surface moving under the fluid handling structure 12 to be re-absorbed into the space 11 or to be extracted through discrete openings 50. The gas flow rate at the trailing edge of the fluid handling structure 12 through the exits 60 is increased to reduce the likelihood of liquid loss due to the liquid experiencing a pulling force on it from, for example, being pinned to an edge of the substrate W over which the fluid handling structure 12 passes.

The fluid handling structure 12 is configured to confine immersion fluid to a region and comprises a gas knife system. The gas knife system may be configured to generate a gas knife in use. The gas knife may be radially outward of the space 11 and may contribute to confining the immersion fluid. The gas knife system comprises passages each having an exit 60. The gas knife may be formed by gas exiting the exits 60 in use. The exits 60 form at least one side of a shape in plan view. The exits 60 may form at least one, multiple or all the sides of the shape in plan view. For example, the exits 60 may form the sides of a four pointed star as shown in FIG. 3. The shape may have a plurality of sides, for example any appropriate number of sides may be provided, e.g. 3, 4, 5, 6, 7, 8, 9, 10 or more. As described above, the exits 60 may form the sides of any shape and this is not limiting. FIG. 3 depicts the scanning direction 110 as in-line with two of the points of the four point star but this may not be the case. The shape formed by the gas knife may be aligned with the scanning direction 110 in any selected orientation.

In the embodiment of FIG. 3 it can be seen that there is fluid flow out of the surface 20 through liquid openings 13 (immersion liquid) and through exits 60 (a flow of gas to form a gas knife). There is also a flow of fluid into the surface 20 (a mixture of gas and immersion liquid) into discrete openings 50.

The present invention relates to a pressure control valve which can be implemented with a limited volume, for example with dimensions in the millimeter range. This enables the valves to be placed in or close to the fluid handling structure 12 such that response times for flow rate variations can be low. This allows liquid and/or gas flows into and out of the fluid handling structure 12 to have their volumetric flow rate quickly changed. In an embodiment, the flow rate can be varied for example between several NLPM and tens of NLPM.

The pressure control valve allows the gas flow around the circumference of the space 11 to be varied, for example according to the direction in which the fluid handling structure 12 is moving relative to the substrate W under the fluid handling structure 12. This can improve the performance of the fluid handling structure 12.

Valves of the invention can achieve a stable flow rate quickly after receiving input signals and can achieve a lifetime of up to several billion switches or more by using piezo actuators. Furthermore, the valves of the invention are constructed to avoid particle generation. This is achieved by reducing or minimising sources of friction in the flow path and avoiding placing ceramics in the flow path.

Figure 4:
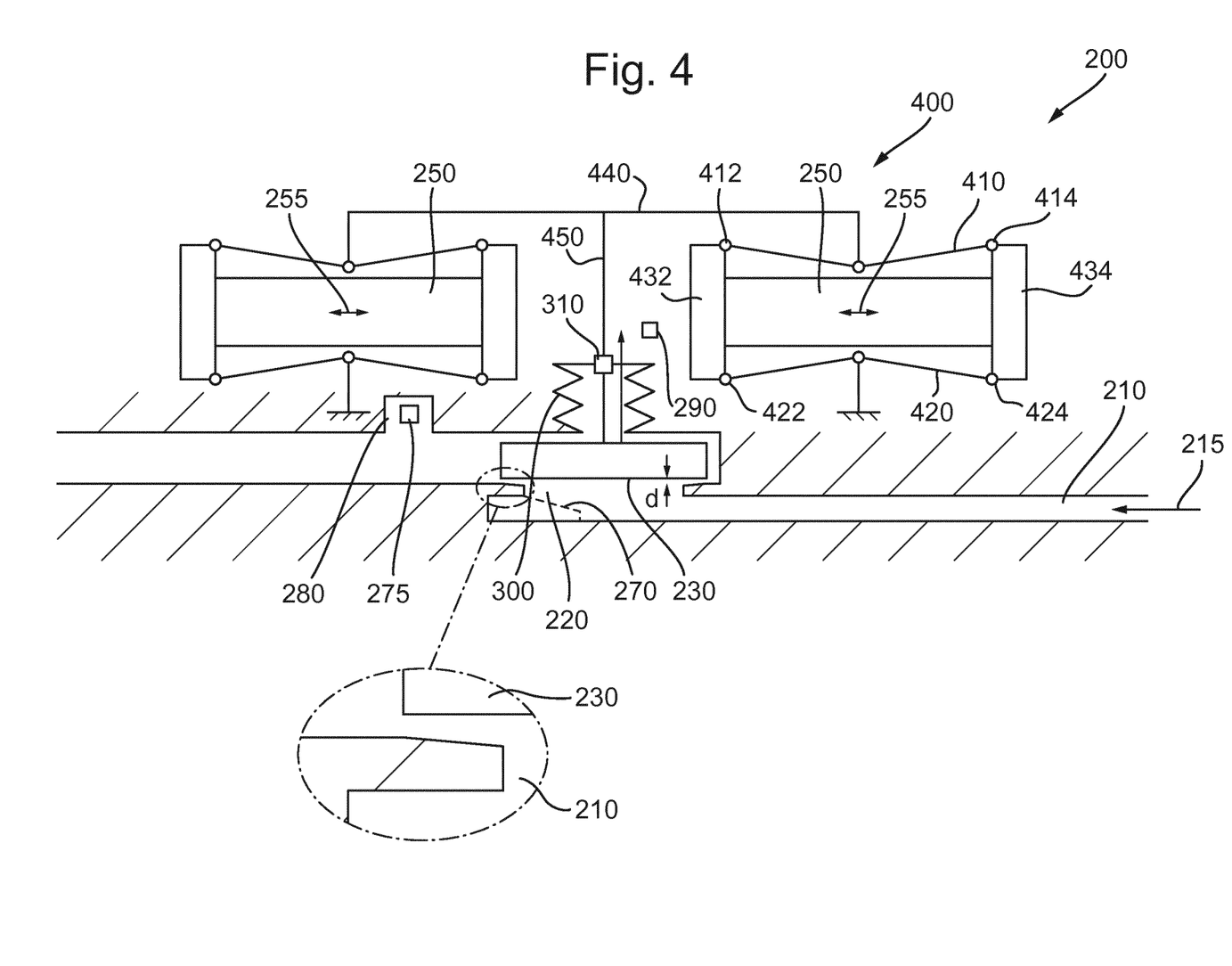
FIG. 4 is a side cross sectional schematic view of a pressure control valve.

FIG. 4 is a schematic illustration of the principle of operation of a pressure control valve 200. The pressure control valve 200 comprises a passageway 210 through which liquid and/or gas flows as indicated by arrow 215. Defined in a portion of the passageway 210 is an opening 220. An obstructing member 230 is also provided within the passageway 210. The obstructing member 230 is displaceable relative to the opening 220, up and down (as illustrated). By varying a distance d between the obstructing member 230 and the portion defining the opening 220, the volumetric flow rate of liquid and/or gas through the opening 220 may be regulated.

The obstructing member 230 and surface radially outward of the opening 220 defining the passageway 210 are formed so that there is a taper (illustrated in magnified view at the bottom left of FIG. 4) between the obstructing member 230 and wall of the passageway 210 to reduce the introduction of turbulence into gas or liquid flow and ensure as constant as possible gas flow velocity in the area where any pressure drop occurs. The taper decreases in width as the distance from the opening 220 increases. Local increases in velocity are reduced thereby to reduce any disturbance forces caused by the flow. Additionally reducing gas velocity variations limits any resulting temperature drop (due to expanding gas) which could increase the chance of condensation and thereby liquid droplet formation.

On or more piezo actuators 250 is/are used to displace the obstructing member 230. The piezo actuator 250 has the advantage of having quick reaction time and long life in terms of number of switches.

However, a piezo actuator is only displaceable by a small amount. In order to avoid the need for very large stacks of piezo electric material, the pressure control valve 200 comprises a linkage mechanism 400 adapted to amplify a magnitude of a dimensional change in the piezo actuator 250. The amplified dimensional change is then used to displace the obstructing member 230 relative to the opening 220. The linkage mechanism 400 can be seen as a range extender. In this way a relatively small piezo actuator 250 can be used to achieve a large range of motion of the obstructing member 230 and thereby achieve the required change in volumetric flow rate through the opening 220. Use of a linkage mechanism 400 which amplifies the magnitude of dimensional change of the piezo actuator 250 limits the size of the obstructing member 230 which needs to be used, the size of the opening 220 which needs to be used as well as the overall height dimension (the dimension perpendicular to the direction of flow 215) of the pressure control valve 200. The use of piezo actuators 250 allows very precise positioning while also being reliable with an extreme lifetime.

The valves have low thermal impact due to the use of piezo actuators 250 in combination with the amplification by the linkage mechanism 400.

In order to avoid two surfaces sliding next to each other (i.e. a source of friction) inside the passageway 210, the obstructing member 230 is desirably arranged such that it is spaced away from the portion of the passageway 210 defining the opening 220 in all positions. That is, desirably the obstructing member 230 can never contact the portion defining the opening 220, thereby to avoid the possibility of formation of particles as a result of friction between the obstructing member 230 and a wall of the passageway 210. The pressure control valve 200 cannot therefore completely shut off the flow of gas. The fact that the obstructing member 230 does not touch or contact the portion of the passageway 210 defining the opening 220 means that no particles can be generated by friction between the portion defining the opening 220 and the obstructing member 230.

The piezo actuator 250 is desirably external of the passageway 210. This is advantageous because piezo actuators 250 frequently generate particles due to their ceramic nature. By maintaining the piezo actuator 250 outside of the passageway 210 any particles which are generated will not find their way into the flow 215 of liquid and/or gas passing through the passageway 210. In this way a source of defects (particles) in any substrate W imaged by the lithographic apparatus is reduced or eliminated.

In order to transfer movement resulting from a dimensional change in the piezo actuator 250 to the obstructing member 230 which is present within the passageway 210 without introducing a source of friction within the passageway 210, a flexible portion 300 defining a portion of a side wall of the passageway 210 is provided. The flexible portion 300 enables the linkage mechanism 400 to transmit movement from outside the passageway 210 to inside the passageway 210 without any surfaces sliding next to each other in the passageway 210 (i.e. it allows the transmission in frictionless way). In an example the flexible portion may be a bellows.

In the valve of FIG. 4, two piezo actuators 250 are provided. However, it will be apparent to the skilled person that the pressure control valve 200 could operate with only a single piezo actuator 250 or more than two piezo actuators. The piezo actuator 250 is arranged to expand and contract on the application of a potential difference in the direction illustrated by arrow 255, namely to the left and right as illustrated.

The linkage mechanism 400 is provided for transferring the dimensional change of the piezo actuator 250 illustrated by arrow 255 into movement of the obstructing member 230 up and down (as illustrated). This results in varying the distance d between the obstructing member 230 and the portion of the passageway 210 defining the opening 220. The volumetric flow rate of liquid and/or gas through the opening 220 and thereby through the passageway 210 can be varied in this way.

The linkage mechanism 400 is adapted to amplify a magnitude of the dimensional change in the piezo actuator 250 so that the obstructing member 230 moves with a magnitude greater than the change in dimension of the piezo actuator 250.

The linkage mechanism 400 comprises a linkage member 450 which is connected to the obstructing member 230. The linkage member 450 passes through a side wall of the passageway 210. Where the linkage member 450 passes through the side wall of the passageway 210 the linkage member 450 is fixed to the side wall at fixation 310 so that there is no source of friction. In order to allow the linkage member 450 to move relative to the passageway 210, the flexible portion 300 of the wall defining the passageway 210 is provided. In the embodiment illustrated the flexible portion 300 is in the form of a bellows. The bellows allow frictionless flexing so that the linkage member 450 can move relative to the passageway 210 (and thereby move the obstructing member 230 relative to the opening 220) without any friction being introduced in the passageway 210 so that the production of particles due to friction is eliminated.

The way in which the linkage mechanism 400 amplifies the magnitude of the dimensional change in the piezo actuator 250 will now be described. A first elongate deformable member 410 is provided with a first end 412 and a second end 414. The first elongate deformable member 410 is elongate in the same direction as any change in dimension of the piezo actuator 250 occurs. The first elongate deformable member 410 has a length greater than the length of the piezo actuator 250. In an example the first elongate deformable member 410 is not straight in any state of deformation by the piezo actuator 250.

As illustrated schematically in FIG. 4, first elongate deformable member 410 is formed of two relatively stiff parts which are hinged to one another at or close to the middle of the first elongate deformable member 410. In another example the first elongate deformable member 410 may be formed of a single flexure or spring which is bent. The first elongate deformable member 410 may be bent either towards or away from the piezo actuator 250.

The first end 412 and second end 414 of the first elongate deformable member 410 are connected to opposite ends of the piezo actuator 250 at first connection 432 and second connection 434 respectively. When the piezo actuator 250 has a potential difference applied to it and expands, this results in the first elongate deformable member 410 having its first and second ends 412, 414 pulled apart. As a result, the magnitude of movement of a central portion (e.g. at the central hinge) of the first elongate deformable member 410 in a direction away from the piezo actuator 250 (in a direction perpendicular to the movement of the piezo actuator 255) is greater than the amount of expansion of the piezo actuator 250 itself. That movement can be transferred to the linkage member 450 and thereby to the obstructing member 230.

In an example, as illustrated in FIG. 4, a second elongate deformable member 420 with a first end 422 and a second end 424 is positioned on a side of the piezo actuator 250 opposite to the first elongate deformable member 410. The second elongate deformable member 420 has its first end 422 fixed to first connection 432 and its second end 424 fixed to second connection 434 in a similar way to the first elongate deformable member 410. Instead of the central portion of the second elongate deformable member 420 being attached to linkage member 450 connected to the obstructing member 230, the central portion of the second elongate deformable member 420 is connected in fixed relation to the passageway 210. As a result the magnitude of the deformation of the piezo actuator 250 is amplified twice, once by the second elongate deformable member 420 (which forces the piezo actuator 250 upwards or downwards, as illustrated and thereby also the first elongate deformable member 410), but also by movement of the first elongate deformable member 410. When the piezo actuators 250 contract in the horizontal direction, the first and second elongate deformable members 410, 420 cause a vertical motion, as illustrated, which is multiple times the motion of the piezo actuator 250. The principle works in the same way as a carjack.

As illustrated in FIG. 4, in an example a second piezo actuator 250 (on the left hand side of FIG. 4) is provided which connected to the linkage mechanism 400 in the same as the first piezo actuator 250. A beam 440 extends between the central portions of the first elongate deformable members 410 of the first and second piezo actuators 250. The beam 440 is connected to the linkage member 450. In this way a relatively flat geometry of pressure control valve is possible and the forces on the piezo actuators 250 are balanced by each other.

In an example the pressure control valve may be formed of metal and the flexible portion 300 may be formed of metal, to avoid outgassing. The metal may be nickel or nickel alloy, stainless steel and/or titanium or a titanium alloy. For example the flexible portion 300 may be a nickel or nickel alloy or stainless steel or titanium or a titanium alloy bellows.

In this and other examples, hinges (illustrated schematically by circles) may be in the form of material (e.g. flexures) of a dimension and elasticity which allow for bending under the forces and over the distances experienced in use. Such hinges do not have any friction and so are preferred because they do not generate particles. In another example, the hinged members may be in the form of leaf springs such that flexing occurs along their entire length, rather than just at the end where the hinge is illustrated in the drawings. In another embodiment, the hinges may be formed by two or more parts moving relative to each other.

Other features which can be implemented include forming the walls defining the passageway 210 as smooth as possible, particularly downstream of the obstructing member 230. This allows a smaller exit for the gas/liquid thereby reducing the volume of the passageway 210 downstream of the obstructing member 230, thereby reducing flow velocity and thus also vibrations. Swirling of gas/liquid as it passes through the opening 220 can occur and if it does occur can result in an unacceptably large pressure drop. To avoid this an obstruction can be placed in the passageway 210. For example the obstruction 270 can be effective to split the flow of gas into two flows of gas/liquid through the passageway, thereby to avoid vortex formation in the pressure control valve. In an embodiment the obstruction 270 is elongate in the direction of the flow, for example in the form of a fin. The obstruction 270 could be central in the flow path (in a cross-section perpendicular to the flow direction) and in a position at which the direction of the flow is changed, for example under the obstructing member 230 in the passageway upstream of the opening 220.

In an embodiment the pressure control valve 200 includes a pressure sensor 275 positioned in fluid communication with the passageway 210 downstream of the opening 220 e.g. in a deadend passageway or recess 280. In the embodiment illustrated in FIG. 4 the pressure sensor 275 is positioned within the flexible portion 300.

In an embodiment a position sensor 290 is adapted to measure the position of the obstructing member 230 (e.g. relative to the opening 220). The position sensor 290 may be positioned inside or outside (as illustrated) of fluid communication with the passageway 210. An advantage of positioning the position sensor 290 inside the passageway 210 is that the position height of the obstructing member 230 could be directly measured (most accurate and any tilt of the obstructing member 230 could also be measured). If the position sensor 290 is outside of the passageway 210, it can measure the position of the linkage member 450, to obtain the relevant information.

The pressure sensor 275 and/or position sensor 290 may be in the form of a MEMS (micro electro mechanical sensor). The output of the pressure sensor 275 and/or position sensor 290 may be provided to a controller. The controller may be adapted to control the pressure control valve 200 at least partly based on the output of the pressure sensor 275 and/or position sensor 290. In an embodiment the controller controls the pressure control valve 200 in a feedback manner by raising or lowering the obstructing member 230 relative to the opening 220 to increase or decrease the pressure at the pressure sensor 275 and thereby change the pressure at the pressure sensor 275 so that it moves closer to a predetermined desired pressure. In a similar way, the controller may control the pressure control valve 200 in a feedback manner using the output of the position sensor 290.

Figure 5:
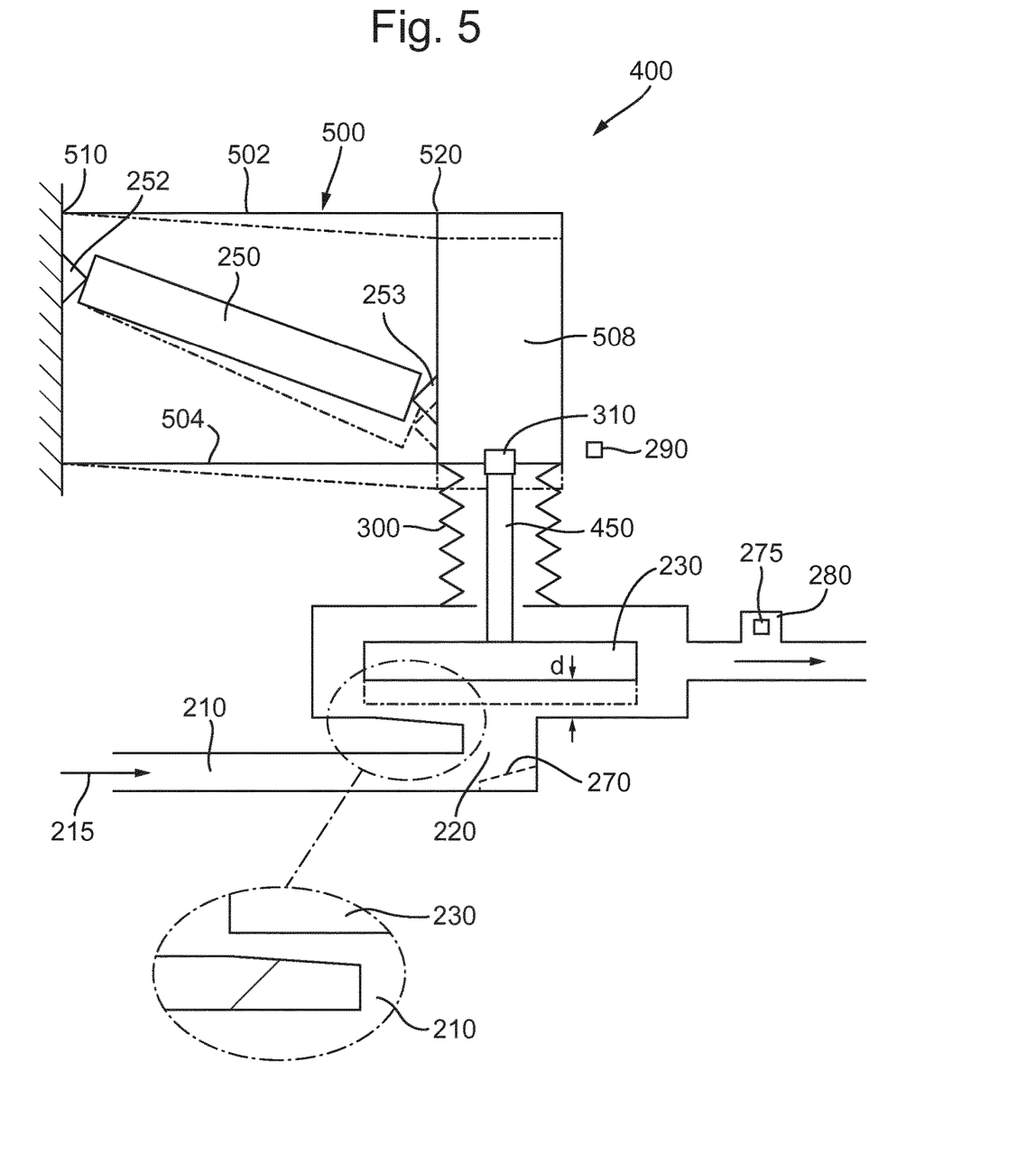
FIG. 5 is a side cross sectional schematic view of a first embodiment of pressure control valve.

A first embodiment is illustrated in FIG. 5. The embodiment of FIG. 5 is the same as the example of FIG. 4 except as described below. Where appropriate, like reference numerals have been used to indicate like components.

In the embodiment of FIG. 5 the linkage mechanism 400 comprises a frame 500. The frame 500 is attached at a first end 510 in fixed relation relative to the passageway 210.

A moveable portion 508 of the frame 500 is moveable (i.e. displaceable) in a first direction (vertically as illustrated) whilst being substantially restrained in the second direction (the horizontal direction as illustrated) and preferably is also substantially restrained in a third direction orthogonal to the first and second directions. This is achieved by providing first and second members 502, 504 which are fixed at the first end 510 in fixed relation relative to the passageway 520 and at a second end 520 to the moveable portion 508. The first and second members 502, 504 are substantially unextendable in the second direction and are deformable in the first direction. For example, the first and second members 502, 504 may be leaf springs.

In an embodiment, the moveable portion 508 is substantially restrained from rotation relative to the passageway 520 in all of three orthogonal directions. In an additional or alternative embodiment, the first and second members 502, 504 are hinged at the first end 510. The first and second members 502, 504 are separated in the first direction thereby substantially to prevent the moveable portion 508 from rotating. Thus, the moveable portion 508 is moveable in the first direction whilst being substantially restrained in the second direction which is orthogonal to the first direction.

A first end 252 of the piezo actuator 250 is attached to a wall in fixed position relative to the first end 510 of the frame 500. The piezo actuator 250 is pivotable at its first end 252. For example the piezo actuator 250 has a hinge at its first end 252. The piezo actuator 250 is connected at its second end 253 to the moveable portion 508. The connection at the second end 253 is a pivoting connection. For example the piezo actuator 250 has a hinge at its second end 253. The hinging function at the first and second ends 252, 253 of the piezo actuator 250 may be accommodated by leaf springs. Thereby the piezo actuator 250 extends between the wall which is fixed relative to the passageway 210 and the moveable portion 508 of the frame 500.

The moveable portion 508 of the frame 500 is attached via the linkage member 450 to the obstructing member 230. A flexible portion 300 and a fixed portion 310 are provided in the same way as described above in relation to FIG. 4.

The piezo actuator 250 is provided at an angle to the second direction. The amplification is determined by the angle. For example, the piezo actuator 250 is provided at an angle of at least 2°, preferably at least 5° or 10° to the second direction. The smaller the angle in which the piezo actuator 250 extends relative to the second direction, the larger the magnification of the movement by the linkage mechanism 400. To ensure sufficient magnification, the angle of the piezo actuator 250 to the second direction is preferably 45° or less, preferably 20° or less. In this way an expansion of the piezo actuator 250 results in movement of the moveable portion 508 downwards as illustrated in dotted lines in FIG. 5. The amount of movement in the first direction (downwards as illustrated) by the moveable portion 508 is greater than the expansion of the piezo actuator 250 due to the frame 500 being adapted to amplify the magnitude of the dimensional change of the piezo actuator 250, as described above.

The moveable portion 508 is illustrated as having a relatively high volume compared to the remainder of the frame 500. However, this need not be the case and the moveable portion 508 could be just a sheet of material, for example metal. In an embodiment the moveable portion 508 has a shape adapted to conform to space limitations in the apparatus. The moveable portion 508 and linkage member 450 can be seen as being parts of the same member i.e. integral.

In an embodiment a second piezo actuator is provided. Like the piezo actuator 250 illustrated in FIG. 5, the second piezo actuator is pivotally attached at a first end to the wall in fixed position relative to the first end 510 and pivotally connected at a second end to the moveable portion 508. The piezo actuator 250 and second piezo actuator can be provided side by side (e.g. in the third direction) or one above the other (e.g. side by side in the first direction).

A further embodiment will now be described with reference to FIG. 6. The embodiment of FIG. 6 is the same as the example of FIG. 4 and the embodiment of FIG. 5 except as described below.

Figure 6:
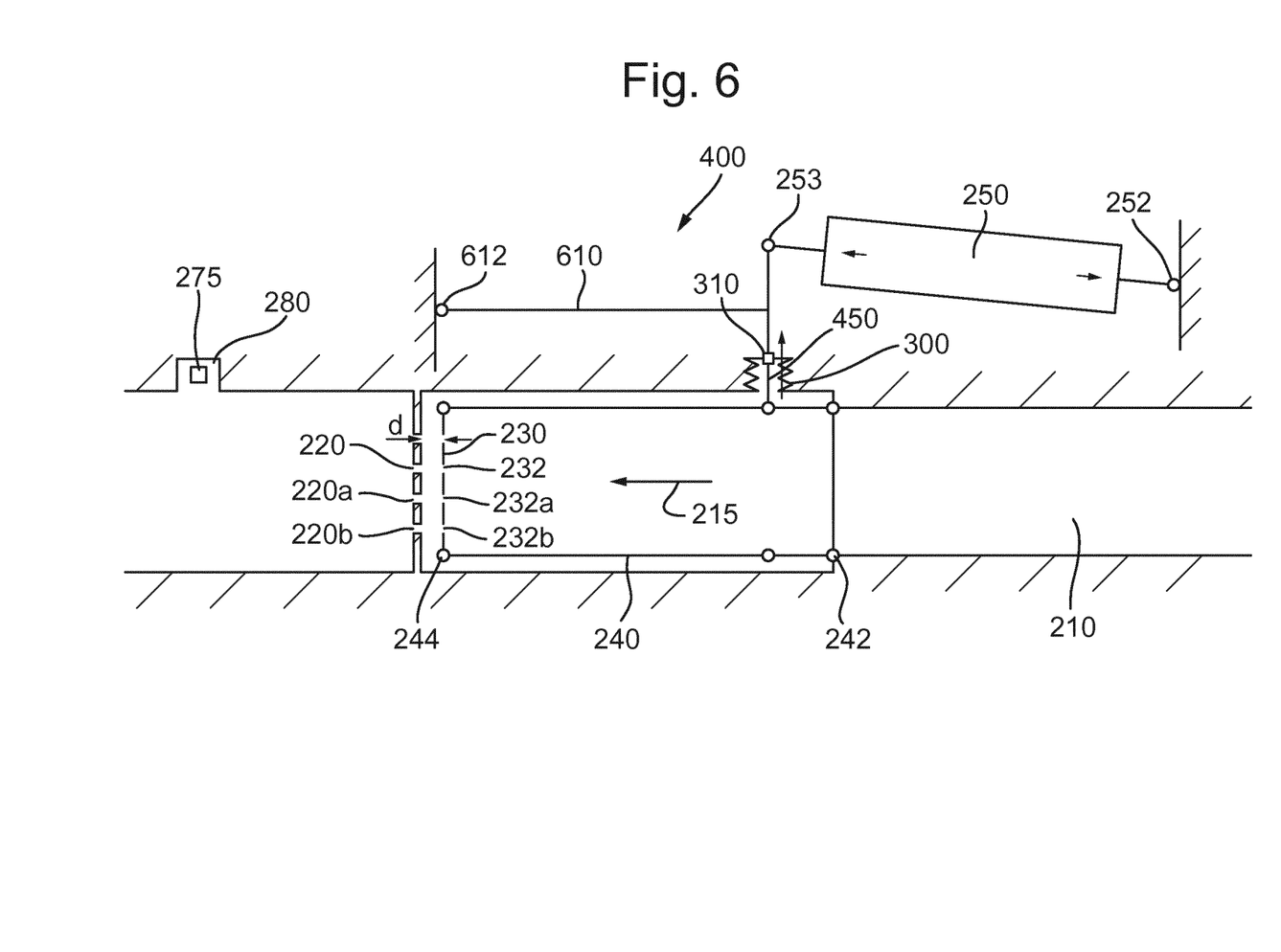
FIG. 6 is a side cross sectional schematic view of a second embodiment of pressure control valve.

In the embodiment of FIG. 6 the linkage mechanism 400 makes use of at least one lever to amplify the expansion and contraction of the piezo actuator 250.

Additionally the mechanism and/or obstructing member 230 for blocking the opening 220 is different to that of the FIG. 4 example and FIG. 5 embodiment. This is not necessarily the case and the mechanism illustrated in FIG. 6 can be adapted for use with the example and embodiment of FIGS. 4 and 5. The mechanism and/or obstructing member 230 for blocking the opening 220 of FIG. 4 or 5 can be adapted for use with the embodiment of FIG. 6.

In the embodiment of FIG. 6, a plurality of openings 220 are provided, for example openings 220*a*, 220*b*. A lever 240 is provided in the passageway 210. The lever 240 is adapted for the flow of gas and/or liquid therethrough. The lever 240 is fixed at its first end 242 relative to the passageway 210. The fixation at the first end 242 may be a pivoting connection, for example a leaf spring or a hinge. In an embodiment the lever 240 is made of a flexible material, such as a leaf spring fixedly attached at the first end 242. Thus bending of the lever 240 between the first end 242 and the position at which a force is applied by the linkage member 450 results in the movement of the second end 244. In this way no particles are generated as the movement is accomplished in a frictionless way.

In an embodiment end stops are provided outside the passageway 210 to limit the vertical movement (as illustrated) of the linkage member 450. This prevents the lever 240 moving so far as to collide with the sidewalls of the passageway 210 and thereby generate particles in the passageway 210.

The force from the piezo actuator 250 is applied by the linkage member 450 at a position between the first end 242 and the second end 244. This has the effect of magnifying the vertical (as illustrated) movement of the linkage member 450 as it is transmitted to the obstructing member 230 at a second end 244 of the lever 240. The obstructing member 230 moves with a magnitude of movement greater than the magnitude of the input motion from the linkage member 450 due to the lever effect. Thus, the lever 240 can be seen as a lever for amplifying the magnitude of the movement resulting from the dimensional change in the piezo actuator 250 and applying the amplified movement to the obstructing member 230. The lever has its fulcrum at the first end 242 and the obstructing member 230 at the second end 244, opposite the first end 242. A second end 244 of the lever 240 is free to move. The second end 244 comprises the obstructing member 230. The obstructing member 230 comprises a plurality of obstructing member openings 232, 232*a*, 232*b*.

In a first position the plurality of obstructing member openings 232, 232*a*, 232*b* line up with the plurality of openings 220, 220*a*, 220*b* defined by the portion of the passageway 210. In this position a maximum volumetric flow rate through the passageway 210 is achieved. When the second end 244 of the lever 240 moves, the obstructing member openings 232, 232*a*, 232*b* no longer align with the openings 220, 220*a*, 220*b* defined by a portion of the passageway 210 such that the volumetric flow rate of liquid and/or gas through the passageway 210 is decreased. Thus translational movement where the distance d between the obstructing member 230 and portion of the passageway 210 defining the opening 220 is constant results in a change in flow rate.

The lever 240 can be seen as part of the linkage mechanism 400. The lever 240 comprises, in an embodiment, upper and lower members, as illustrated, which are spaced apart with the flow 215 flowing between the upper and lower members. This provides stiffness and ensures that the obstructing member 230 remains substantially parallel to the portion of the passageway 210 in which the openings 220, 220*a*, 220*b* are formed. In an embodiment the lever 240 extends in a direction in and out of the page thereby to provide rigidity against rotation in the plane of the paper.

In the embodiment of FIG. 6 the linkage mechanism 400 further comprises a hinged member 610 which is hinged at a first portion 612 in fixed relation relative to the passageway 210.

In the FIG. 6 embodiment the linkage member 450 is constrained from moving in a second direction but may move up and down in a first direction (orthogonal to the second direction) in a similar way to the moveable portion 508 of the embodiment of FIG. 5. In the FIG. 6 embodiment the linkage member 450 is constrained from moving in the second direction by a part of the hinged member 610 and by the attachment between the linkage member 450 and the lever 240. Like in the embodiment of FIG. 5, the piezo actuator 250 is connected at a first end 252 to a fixed position relative to the passageway 210 and at a second end 253 to the linkage member 450. In an alternative embodiment, the piezo actuator 250 could be positioned on the same side of linkage member 450 as hinged member 610, like in the embodiment of FIG. 5.

The ends of the piezo actuator 250 are connected are such that the piezo actuator 250 makes an angle relative to the second direction like the embodiment of FIG. 5. As the piezo actuator 250 expands and contracts this results in movement of the linkage member 450 up and down as illustrated by a greater amount than the piezo actuator 250 expands and contracts.

Another way of looking at the FIG. 6 embodiment is that the hinged member 610 includes the linkage member 450 to which it is fixedly connected. In that case the hinged member 610 is hinged at a first portion 612 at a position fixed relative to the passageway 210. A second portion of the hinged member 610 is hinged to the piezo actuator 250. A third portion of the hinged member 610 is hinged to the lever 240 (which lever 240 includes the obstructing member 230). Expansion of the piezo actuator 250 results in movement of the third portion (the linkage member 450) relative to the passageway 210 with a magnitude greater than the magnitude of expansion of the piezo actuator 250. The pressure control value may be used in a clamp for a substrate or to control gas flow directed at or in the vicinity of a patterning device of a lithographic apparatus.

In an embodiment, there is provided a pressure control valve comprising: a passageway having a portion defining an opening for the flow of liquid and/or gas therethrough; an obstructing member displaceable relative to the opening for obstructing the opening by differing amounts thereby to regulate a volumetric flow rate of liquid and/or gas through the opening; a piezo actuator; and a linkage mechanism adapted to amplify a magnitude of a dimensional change in the piezo actuator and to use the amplified dimensional change to displace the obstructing member relative to the opening, wherein the linkage mechanism comprises a frame attached to a wall and fixed at a first end in relation to the passageway, a moveable portion of the frame moveable in a first direction whilst being substantially restrained in a second direction orthogonal to the first direction, the piezo actuator extending between the wall and the moveable portion such that an expansion of the piezo actuator results in movement of the moveable portion in the first direction by an amount greater than the expansion of the piezo actuator, the moveable portion connected to the obstructing member.

In an embodiment, the piezo actuator is provided at an angle of at least 2° to the second direction and/or at an angle of 45° or less to the second direction. In an embodiment, the piezo actuator is external of the passageway. In an embodiment, the piezo actuator is attached at a first end to the wall and connected at a second end to the moveable portion. In an embodiment, the obstructing member is arranged such that the obstructing member is spaced apart from the portion of the passageway defining the opening in all positions. In an embodiment, the pressure control valve further comprises a flexible portion defining a portion of a sidewall of the passageway, the flexible portion adapted to enable by frictionless flexing the linkage mechanism to transmit movement from outside the passageway to inside the passageway thereby to displace the obstructing member. In an embodiment, the flexible portion is a bellow. In an embodiment, the flexible portion comprises a metal, preferably nickel or a nickel alloy, or a stainless steel or titanium or a titanium alloy. In an embodiment, the pressure control valve further comprises an obstruction in the passageway placed and shaped to separate the flow of liquid and/or gas through the passageway into two separate flows, thereby to avoid vortex formation in the pressure control valve. In an embodiment, the pressure control valve further comprises a pressure sensor positioned downstream of the opening and/or a position sensor to measure a position of the obstructing member. In an embodiment, the pressure control valve further comprises a controller adapted to control the pressure control valve at least partly based on a feed-back loop involving a signal indicative of pressure from the pressure sensor and/or a signal indicative of the position of the obstructing member from the position sensor. In an embodiment, the linkage mechanism comprises a lever for amplifying the magnitude of the dimensional change in the piezo actuator. In an embodiment, the lever has its fulcrum at a first end and the obstructing member at a second end opposite the first end such that force from the piezo actuator is applied between the first end and the second end. In an embodiment, the lever is in the passageway. In an embodiment, the linkage mechanism further comprises a hinged member hinged at a first portion in a fixed position relative to the passageway, at a second portion to a first end of the piezo actuator and at a third portion via linkage to the obstructing member, the piezo actuator having a second end hinged in fixed position relative to the passageway such that an expansion of the piezo actuator results in movement of the third portion relative to the passageway with a magnitude greater than the magnitude of the expansion. In an embodiment, the portion of the passageway defines a plurality of the openings for the flow of liquid and/or gas therethrough and the obstructing member comprises a plurality of through holes which align with the plurality of the openings for the maximum volumetric flow rate and which are movable out of alignment with the plurality of openings thereby to reduce the volumetric flow rate. In an embodiment, a surface of the obstructing member and a surface defining the passageway radially outward of the opening are tapered.

In an embodiment, there is provided a pressure control valve comprising: a passageway having a portion defining an opening for the flow of liquid and/or gas therethrough; an obstructing member displaceable relative to the opening for obstructing the opening by differing amounts thereby to regulate a volumetric flow rate of liquid and/or gas through the opening; and an obstruction in the passageway which is central in the passageway and elongate in the direction of flow and constructed to split the flow of liquid and/or gas into two flows through the passageway.

In an embodiment, there is provided a fluid handling structure configured to confine immersion fluid to a region of a lithographic apparatus comprising the pressure control valve as described herein.

In an embodiment, there is provided an immersion lithographic apparatus comprising the fluid handling structure as described herein.

The skilled artisan will appreciate that, in the context of alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

The pressure control valve can be used in other applications not limited to lithography. Atomic layer deposition and electron microscopy may benefit from the invention as these technologies require extremely clean gas flows.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A pressure control valve comprising:
  a passageway having a portion defining an opening for the flow of liquid and/or gas therethrough;
  an obstructing member, displaceable relative to the opening, to obstruct the opening by differing amounts to regulate a volumetric flow rate of liquid and/or gas through the opening;
  a piezo actuator; and
  a linkage mechanism configured to amplify a magnitude of a dimensional change in the piezo actuator and to use the amplified dimensional change to displace the obstructing member relative to the opening,
  wherein the linkage mechanism comprises one or more members attached, or attachable, to a wall so as to be fixed at a first end in relation to the passageway, a moveable member of the one or more members moveable in a first direction while being substantially restrained in a second direction orthogonal to the first direction, the piezo actuator extending, or arranged to extend, between the wall and the moveable member such that an expansion of the piezo actuator results in movement of the moveable member in the first direction by an amount greater than the expansion of the piezo actuator, the moveable member connected to the obstructing member.

2. The pressure control valve of claim 1, wherein, in use, the piezo actuator is provided at an angle of at least 2° to the second direction.

3. The pressure control valve of claim 1, wherein the obstructing member is arranged such that the obstructing member is spaced apart from the portion of the passageway defining the opening in all positions.

4. The pressure control valve of claim 1, further comprising a flexible portion defining a portion of a sidewall of the passageway, the flexible portion adapted to enable, by flexing, the linkage mechanism to transmit movement from outside the passageway to inside the passageway to displace the obstructing member.

5. The pressure control valve of claim 4, wherein the flexible portion is a bellow, and/or the flexible portion comprises a metal.

6. The pressure control valve of claim 1, further comprising an obstruction in the passageway placed and shaped to separate the flow of liquid and/or gas through the passageway into two separate flows.

7. The pressure control valve of claim 6, further comprising a controller configured to control the pressure control valve at least partly based on a feed-back loop involving a signal indicative of pressure from a pressure sensor and/or a signal indicative of a position of the obstructing member from a position sensor.

8. The pressure control valve of claim 1, wherein the linkage mechanism comprises a lever configured to amplify the magnitude of the dimensional change in the piezo actuator.

9. The pressure control valve of claim 8, wherein the lever has its fulcrum at a first end and the obstructing member at a second end opposite the first end such that force from the piezo actuator is applied between the first end and the second end and/or the lever is in the passageway.

10. The pressure control valve of claim 8, wherein the portion of the passageway defines a plurality of the openings for the flow of liquid and/or gas therethrough and the obstructing member comprises a plurality of through holes which align with the plurality of the openings for a maximum volumetric flow rate and which are movable out of alignment with the plurality of openings to reduce the volumetric flow rate.

11. The pressure control valve of claim 1, wherein the linkage mechanism further comprises a hinged member hinged at a first portion so as to be in a fixed position relative to the passageway, at a second portion to a first end of the piezo actuator and at a third portion via linkage to the obstructing member, the piezo actuator having a second end hinged so as to be in fixed position relative to the passageway such that an expansion of the piezo actuator results in movement of the third portion relative to the passageway with a magnitude greater than the magnitude of the expansion.

12. The pressure control valve of claim 1, wherein a surface of the obstructing member and a surface defining the passageway radially outward of the opening are tapered.

13. The pressure control valve of claim 1, wherein, in use, the piezo actuator is provided at an angle of at least 2° but less than or equal to 45° to the second direction.

14. A fluid handling structure configured to confine immersion fluid to a region of a lithographic apparatus, the fluid handling structure comprising the pressure control valve of claim 1.

15. An immersion lithographic apparatus comprising the fluid handling structure of claim 14.

16. The pressure control valve of claim 1, wherein the piezo actuator is external of the passageway.

17. The pressure control valve of claim 1, wherein the piezo actuator is attached or attachable at a first end to the wall and connected at a second end to the moveable member.

18. The pressure control valve of claim 1, further comprising a pressure sensor positioned downstream of the opening.

19. The pressure control valve of claim 1, further comprising a position sensor to measure a position of the obstructing member.

20. A pressure control valve comprising:
a passageway having a portion defining an opening for the flow of liquid and/or gas therethrough;
a member, displaceable relative to the opening, to obstruct the opening by differing amounts to regulate flow of liquid and/or gas through the opening;
an actuator; and
a linkage mechanism configured to amplify a magnitude of a dimensional change in the actuator and to use the amplified dimensional change to displace the member relative to the opening,
wherein the linkage mechanism comprises a structure arranged to be fixed at an end in relation to the passageway, a moveable portion of the structure moveable in a first direction while being substantially restrained in a second direction orthogonal to the first direction, the actuator extending, or arranged to extend, between a wall and the moveable portion such that an expansion of the actuator results in movement of the moveable portion in the first direction by an amount greater than the expansion of the actuator, the moveable portion connected to the member.

* * * * *